United States Patent
Clingman et al.

(10) Patent No.: US 10,622,543 B2
(45) Date of Patent: Apr. 14, 2020

(54) PIEZOELECTRIC BIMORPH DISK OUTER BOUNDARY DESIGN AND METHOD FOR PERFORMANCE OPTIMIZATION

(71) Applicant: The Boeing Company, Chicago, IL (US)

(72) Inventors: Dan J. Clingman, Milton, WA (US); Aaron M. Sassoon, St. Louis, MO (US)

(73) Assignee: The Boeing Company, Chicago, IL (US)

( * ) Notice: Subject to any disclaimer, the term of this patent is extended or adjusted under 35 U.S.C. 154(b) by 505 days.

(21) Appl. No.: 15/403,606

(22) Filed: Jan. 11, 2017

(65) Prior Publication Data

US 2018/0198054 A1 Jul. 12, 2018

(51) Int. Cl.
*H01L 41/09* (2006.01)
*H01L 41/053* (2006.01)
*H01L 41/27* (2013.01)
*H04R 17/00* (2006.01)

(52) U.S. Cl.
CPC ........ *H01L 41/0973* (2013.01); *H01L 41/053* (2013.01); *H01L 41/27* (2013.01); *H04R 17/00* (2013.01); *B64C 2230/18* (2013.01)

(58) Field of Classification Search
CPC ............................ H01L 41/0973; H01L 41/053
USPC ........................................................ 310/324
See application file for complete search history.

(56) References Cited

U.S. PATENT DOCUMENTS

| 5,758,823 A | 6/1998 | Glezer et al. |
|---|---|---|
| 7,686,257 B2 | 3/2010 | Saddoughi et al. |
| 8,052,069 B2 | 11/2011 | Xu et al. |
| 2002/0149296 A1 | 10/2002 | Fujii et al. |
| 2009/0244129 A1 | 10/2009 | Katayama et al. |
| 2011/0147476 A1 | 6/2011 | Saddoughi et al. |
| 2012/0091266 A1 | 4/2012 | Whalen et al. |
| 2013/0043766 A1* | 2/2013 | Takahashi ............... H04R 7/20 310/326 |

(Continued)

FOREIGN PATENT DOCUMENTS

| CN | 101646116 A | 2/2010 |
|---|---|---|
| WO | WO-2012/002942 A1 | 1/2012 |

OTHER PUBLICATIONS

Search Report for related European Application No. 17203726.9; report dated Jun. 21, 2018.

(Continued)

*Primary Examiner* — Derek J Rosenau
(74) *Attorney, Agent, or Firm* — Miller, Matthias & Hull LLP

(57) ABSTRACT

A bimorph disk actuator is disclosed including a substrate formed from a substrate composite material and having a first substrate surface and a second substrate surface, a first piezoceramic disk rigidly connected to the first substrate surface of the substrate, a second piezoceramic disk rigidly connected to the second substrate surface of the substrate, and a first composite ring formed from a first ring composite material, rigidly connected to the first substrate surface and surrounding the first piezoceramic disk. A second composite may be rigidly connected to the second substrate surface and surrounding the second piezoceramic disk. A method and apparatus for forming the bimorph disk actuator are also disclosed.

20 Claims, 5 Drawing Sheets

(56) References Cited

U.S. PATENT DOCUMENTS

2013/0336820 A1    12/2013  Griffin et al.
2014/0015377 A1*   1/2014   Onishi .................. H04R 17/10
                                                    310/325

OTHER PUBLICATIONS

"Electroactive Polymer Synthetic Jet Actuators ("EJETs") for Low Speed Active Flow Control"; Morpheus Laboratory Department of Aerospace Engineering.

"Secondary Flow Structures Due to Interaction Between a Finite-Span Synthetic Jet and a 3-D Cross Flow"; CeFPaC the Center for Flow, Physics, and Control; Rensselaer School of Engineering; Sponsor: AFOSR; Project Duration: Apr. 2008-May 2011; PI: Professor Miki Amitay: Graduate Student: Joseph Vasile.

"Evaluation and Opportunities for Use of Thin Form Factor Synthetic Jets to Low Profile Electronics Cooling Applications"; Dec. 18, 2012; by: Peter de Bock, Andrew Mann and Bryan Whalen; Issued Dec. 2012.

"Piezo Motion for Precision Positioning Introduction"; blog; pp. 1-2; http://www.pi-usa.us/tutorial/4_22.html#4_23.

"Piezo Design: Fundamentals of Piezoelectric Actuation"; blog; pp. 1-12; http.//www.piezo.ws/piezoelectric_actuator_tutorial/Piezo_Design_part3.php.

* cited by examiner

PIEZOELECTRIC BIMORPH DISK OUTER BOUNDARY DESIGN AND METHOD FOR PERFORMANCE OPTIMIZATION

TECHNICAL FIELD

The present invention relates generally to piezoelectric actuators and, in particular, to piezoelectric actuators for synthetic jets and other devices having orthotropic piezoelectric bimorphs with outer ring properties controlled to improve the performance of the synthetic jet.

BACKGROUND

In recent years, active flow control has been used to increase the aerodynamic efficiency of machines having air flow over a surface, in particular vehicles such as airplanes. Adverse fluid flows generated over aerodynamic surfaces can buffet and fatigue downstream structures exposed to the flows, and the flows can affect efficiency by increasing drag or resistance over the surface. In one version of active flow control, jets of air are blown into the path of the adverse fluid flows to mix with the flows and cause the air to flow more smoothly over the aerodynamic surfaces and reduce the drag and resistance over the surfaces. In many cases, such active flow control can be implemented in existing vehicle designs without needing significant changes thereby directly reducing the operating cost of the vehicle or other machine.

One device for creating jets of air in active flow control is a synthetic jet that forms a jet flow by moving air back and forth through a small opening of the device. Synthetic jets typically have a housing in the shape of a hollow box or cylinder with a resonant chamber therein and an orifice or nozzle opening through one of the side or end walls. At least one wall of the synthetic jet is formed from a flexible membrane that can deflect inwardly and outwardly to alternately decrease and increase the volume in the resonant chamber and expel and draw in air through the opening. Deflection of the membrane may be caused by a piezoelectric actuator that responds to an applied electric field. The piezoelectric actuator may include one or more piezoceramic disks attached to the membrane.

For each piezoceramic disk, electrodes are attached to the opposing planar surfaces of the disk for application of the electric field across the thickness of the plate. Due to the converse piezoelectric effect, the applied electric field causes stresses and mechanical deformation through the thickness of the plate, and corresponding stresses and mechanical deformation occur in the plane of the plate due to the Poisson effect. In-plane deformation of the plate creates bending moments on the membrane and deflection of the membrane relative to the resonant chamber. Alternating the polarity of the electric fields across the plates causes the plates to alternately compress and elongate. Alternating the electric field at a high frequency causes rapid vibration of the membrane and creation of high velocity flow through the opening of the synthetic jet.

Two actuator topologies are available commercially. The first topology, or unimorph, attaches a single piezoceramic wafer to a metallic substrate that extends to form a passive outer ring. The metallic substrate provides a passive structure to react with the piezoelectric induced strain which bends the unimorph. The unimorph topology has reduced performance because a significant amount of piezoelectric induced strain energy is used to bend the stiff metallic substrate of the unimorph, and consequently is not available to perform work to generate puffs of air from the synthetic jet. The second topology, or bimorph, involves bonding two piezoceramic wafers together with a thin layer of epoxy and Kapton®. The outer surface of the bonded wafers is encapsulated in Kapton®. A passive outer ring is formed by adding a filler between the outer edges of the piezoceramic wafers and the outer diameter of the bimorph actuator and providing a constant thickness across the device.

SUMMARY OF THE DISCLOSURE

In one aspect of the present disclosure, a bimorph disk actuator is disclosed. The bimorph disk actuator includes a substrate formed from a substrate composite material and having a first substrate surface and a second substrate surface, a first piezoceramic disk rigidly connected to the first substrate surface of the substrate, a second piezoceramic disk rigidly connected to the second substrate surface of the substrate, and a first composite ring formed from a first ring composite material, rigidly connected to the first substrate surface and surrounding the first piezoceramic disk.

In another aspect of the present disclosure, a method for forming a bimorph disk actuator is disclosed. The method includes rigidly connecting a first piezoceramic disk to a first substrate surface of a substrate formed from a substrate composite material, rigidly connecting a second piezoceramic disk to a second substrate surface of the substrate, installing a first composite ring formed from a first ring composite material around the first piezoceramic disk and in contact with the first substrate surface, closing an actuator forming apparatus with a first mold body facing and engaging the first piezoceramic disk and a second mold body facing and engaging the second piezoceramic disk, and applying by the first mold body and the second mold body at least one of pressure and heat to the first composite ring to rigidly connect the first composite ring to the first substrate surface of the substrate.

In further aspect of the present disclosure, an actuator forming apparatus for forming a bimorph disk actuator is disclosed. The bimorph disk has a substrate, a first piezoceramic disk rigidly connected to a first substrate surface of the substrate, a second piezoceramic disk rigidly connected to a second substrate surface of the substrate, and a first composite ring installed around the first piezoceramic disk and in contact with the first substrate surface. The actuator forming apparatus includes a first mold body having first mold planar surface for facing and engaging the first piezoceramic disk when the actuator forming apparatus is closed on the bimorph disk actuator, a second mold body having second mold planar surface for facing and engaging the second piezoceramic disk when the actuator forming apparatus is closed on the bimorph disk actuator, and a first spacer ring that is installed around the first piezoceramic disk and in contact with the first composite ring if a first composite ring thickness is less than a disk thickness.

Additional aspects are defined by the claims of this patent.

DETAILED DESCRIPTION

Figure 1:
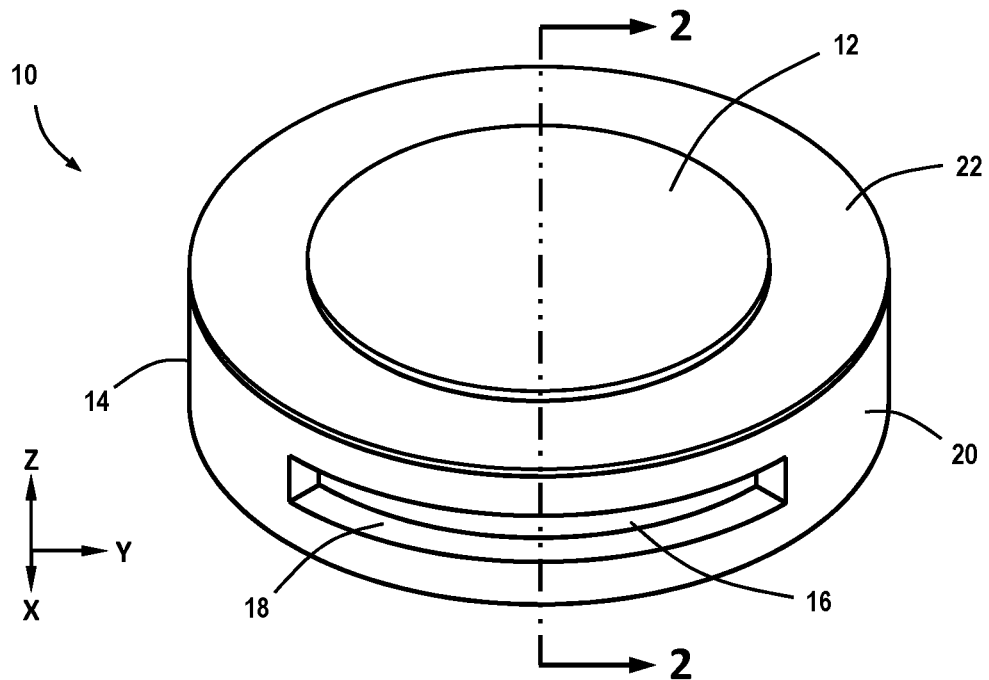
FIG. 1 is an isometric view of a synthetic jet in which a piezoelectric bimorph disk actuator in accordance with the present disclosure may be implemented.

FIG. 1 illustrates one exemplary device in the form of a synthetic jet 10 in which an embodiment of a modified bimorph topology having a piezoelectric bimorph disk actuator 12 in accordance with the present disclosure may be implemented. Using the design as described herein, the bimorph disk actuator 12 is fabricated from standard piezoceramic disks, but is customizable to be matched to the particular operating requirements of a variety of synthetic jets 10 by manipulating the dimensions and material properties of a passive outer ring of the bimorph disk actuator 12. The illustrative synthetic jet 10 has the shape of a hollow cylinder, but synthetic jets known in the art may be rectangular prisms or have other appropriate shapes as necessary to create the desired air flow characteristics. The synthetic jet 10 has an outer housing 14 defining a resonant chamber 16 therein having a resonant chamber inner diameter $ID_C$. An orifice 18 is defined through a cylindrical side wall 20 of the synthetic jet housing 14 to place the resonant chamber 16 in fluid communication with the ambient atmosphere surrounding the synthetic jet 10. At least one end wall of the synthetic jet housing 14 is formed by the bimorph disk actuator 12 that has material to create a membrane or diaphragm 22 that can vibrate to change the volume of the resonant chamber 16 to induce air to be alternately ejected from and drawn in through the orifice 18. The diaphragm 22 may be formed from one or more layers of flexible composite material that may have their dimensions and material properties manipulated as discussed further hereinafter to yield required operating characteristics of a particular implementation of the bimorph disk actuator 12.

Figure 2:
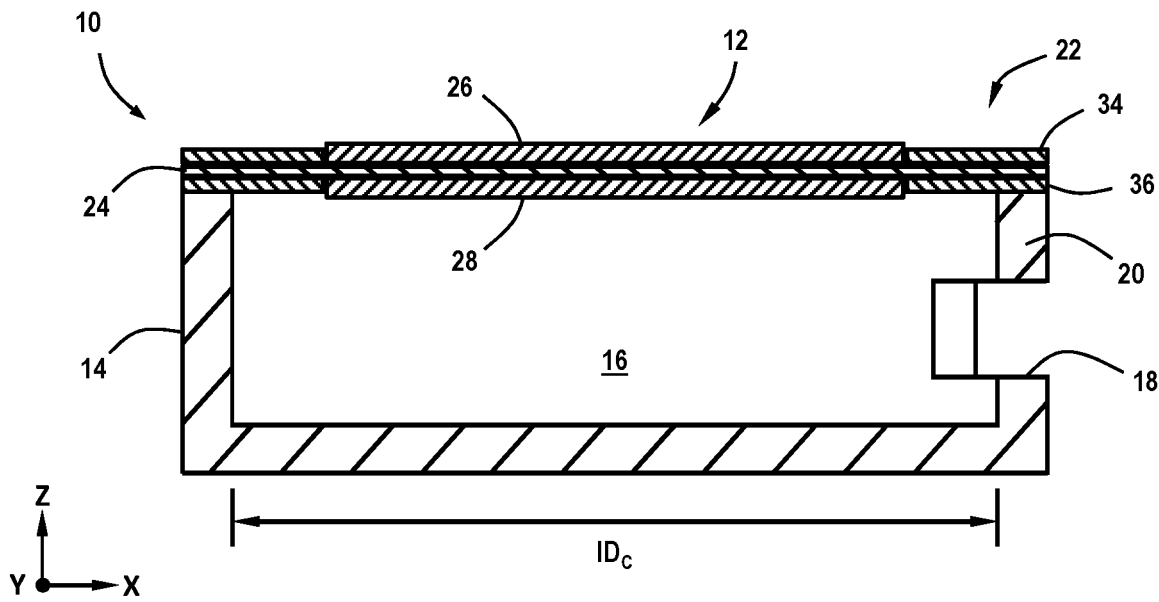
FIG. 2 is a cross-sectional view of the synthetic jet of FIG. 1 taken through line 2-2 with the bimorph disk actuator in a neutral position.
Figure 3:
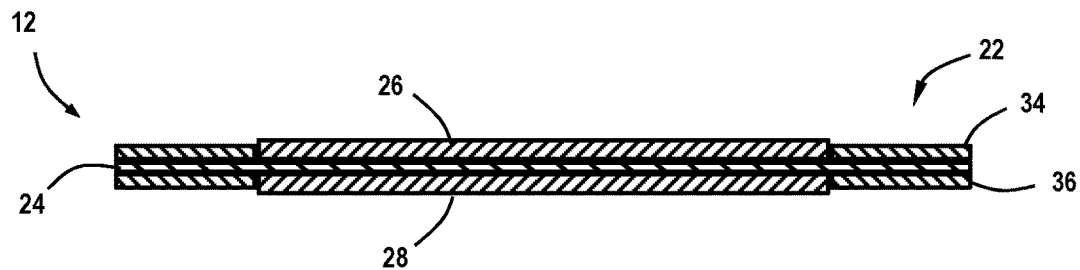
FIG. 3 is a cross-sectional view of the bimorph disk actuator of the synthetic jet of FIG. 1.
Figure 4:
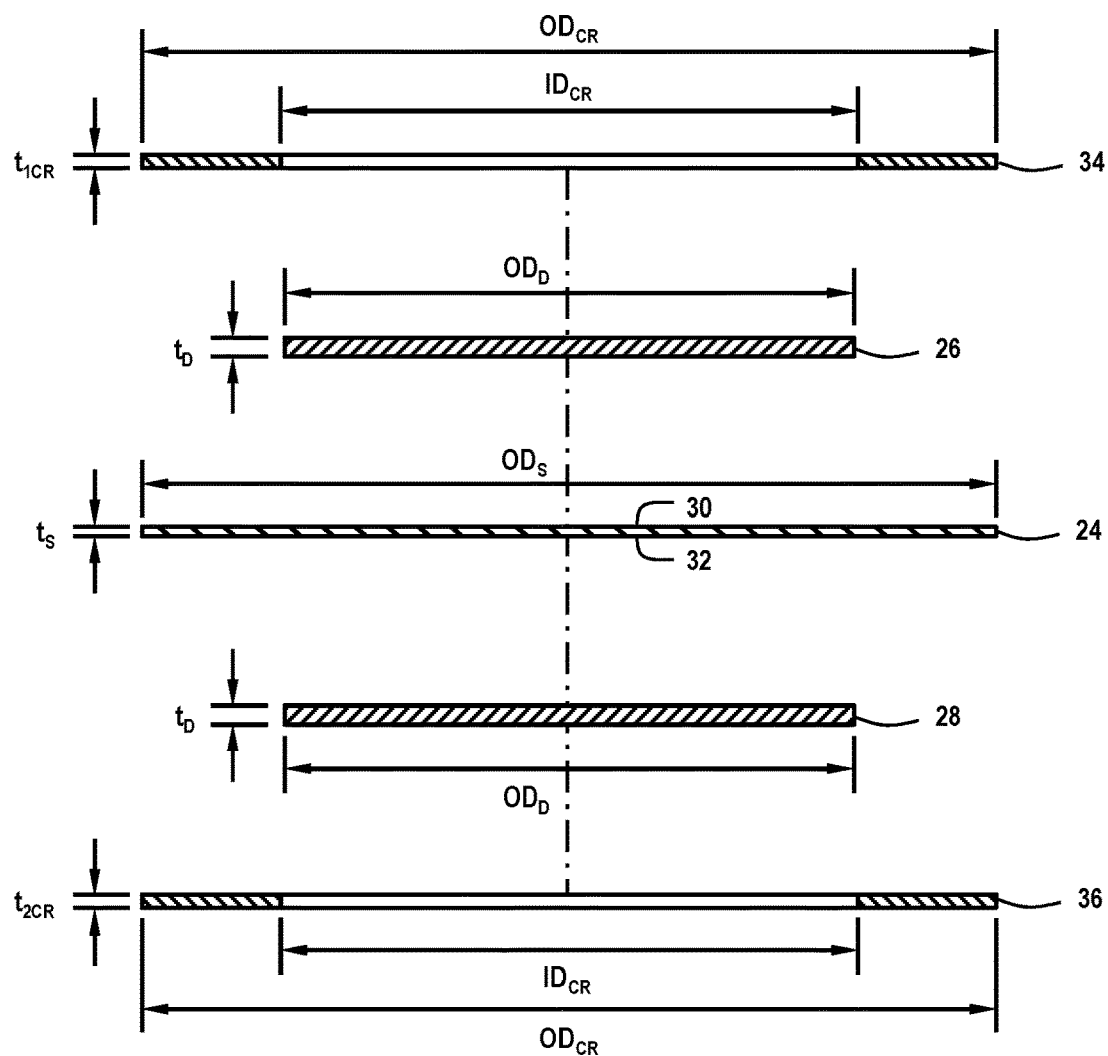
FIG. 4 is an exploded cross-sectional view of the bimorph disk actuator of the synthetic jet of FIG. 1.

The bimorph disk actuator 12 may be operatively connected to the side wall 20 so that bending moments are created that cause the diaphragm 22 to deflect into and out of the resonant chamber 16 as discussed further below. FIG. 2 provides a cross-sectional view of the synthetic jet 10, FIG. 3 illustrates the bimorph disk actuator 12 in cross-section and separated from the synthetic jet 10, and FIG. 4 is an exploded view showing the components of the bimorph disk actuator 12 separated and in cross-section. The following discussion will correspond to FIGS. 2-4 collectively, and discussion relevant to a particular one of the drawing figures will be noted as may be necessary. The bimorph disk actuator 12 includes a flexible substrate 24 that forms a foundation for the bimorph disk actuator 12, and for the diaphragm 22 in particular. The substrate 24 is sandwiched between a first planar piezoceramic disk 26 and a second planar piezoceramic disk 28. The first piezoceramic disk 26 is rigidly secured to a first substrate surface 30, and the second piezoceramic disk 28 is rigidly secured to a second substrate surface 32, with the piezoceramic disks 26, 28 being generally concentrically aligned with the substrate 24. Each of the piezoceramic disks 26, 28 has a disk thickness $t_D$ and a disk outer diameter $OD_D$. The substrate 24 extends outwardly beyond the edges of the piezoceramic disks 26, 28 and has a substrate outer diameter $OD_S$ that is greater than the disk outer diameter $OD_D$ and greater than the resonant chamber inner diameter $ID_C$ so that the substrate 24 overhangs the side wall 20 of the synthetic jet housing 14.

The substrate 24 is a flexible circular membrane may be formed from a composite material such as epoxy infused with glass, fiber, carbon or other appropriate material. The substrate 24 is made as thin as possible, and has a substrate thickness $t_S$. The thinness will cause the substrate 24 to have a small but measurable substrate stiffness $D_S$ that may be variable by manipulating fill ratio of the infused material embedded in the epoxy to the epoxy surrounding it to achieve a desired substrate elasticity modulus $E_S$. The piezoceramic disks 26, 28 may be formed from an appropriate piezoelectric material, such as quartz, lead zirconate titanate (PZT) or other synthetic piezoelectric ceramic or crystals, and have a known disk elasticity modulus $E_D$ and disk Poisson's ratio $\gamma_D$. In addition to the uniform disk outer diameter $OD_D$, the disk thickness $t_D$ of the piezoceramic disks 26, 28 may be uniform. However, it is contemplated that certain implementations may dictate that the piezoceramic disks 26, 28 having different disk thicknesses $t_D$. A disk bending stiffness $D_D$ of the piezoceramic disks 26, 28 may be calculated using the disk elasticity modulus $E_D$, the disk thickness $t_D$ and the disk Poisson's ratio $\gamma_D$ in the manner known in the art.

In the illustrated embodiment, a stiffness $D_A$ of the bimorph disk actuator 12 is varied by attaching a first composite ring 34 to the first substrate surface 30 in the area extending beyond the piezoceramic disks 26, 28 and, if necessary, attaching a second composite ring 36 to the second substrate surface 32 in the same area. The composite rings 34, 36 may be formed from flexible materials similar to the substrate 24, such as the epoxy infused with glass, fiber, carbon or other appropriate materials. The composite rings 34, 36 are configured to fit over or around the corresponding piezoceramic disks 26, 28. The composite rings 34, 36 have a composite ring inner diameter $ID_{CR}$ that is greater than the disk outer diameter $OD_D$. Further, the composite rings 34, 36 have a composite ring outer diameter $OD_{CR}$ that is greater than the resonant chamber inner diameter $ID_C$ and approximately equal to the substrate outer diameter $OD_S$ so that the composite rings 34, 36 also overhang the side wall 20. With this overlapping configuration, one of the composite rings 34, 36, i.e., the second composite ring 36 in the present example, is affixed to the side wall 20 so that the bimorph disk actuator 12 forms the end wall of the synthetic jet 10 as seen in FIG. 2.

The first composite ring 34 has a first composite ring thickness $t_{1CR}$, and the second composite ring 36 has a second composite ring thickness $t_{2CR}$ that may be equal to the first composite ring thickness $t_{1CR}$, or may be different depending on how the bimorph disk actuator 12 is configured to meet the operating requirements of the synthetic jet 10. In general, however, the composite ring thicknesses $t_{1CR}$, $t_{2CR}$ will be less than or equal to the disk thickness $t_D$ so the composite rings 34, 36 do not extend from the substrate surfaces 30, 32, respectively, farther than the piezoceramic disks 26, 28. A maximum thickness of the bimorph disk actuator 12 equal to two times the disk thickness $t_D$ plus the substrate thickness $t_S$ is greater than the sum of the composite ring thicknesses $t_{1CR}$, $t_{2CR}$ plus the substrate thickness $t_S$.

Figure 5:
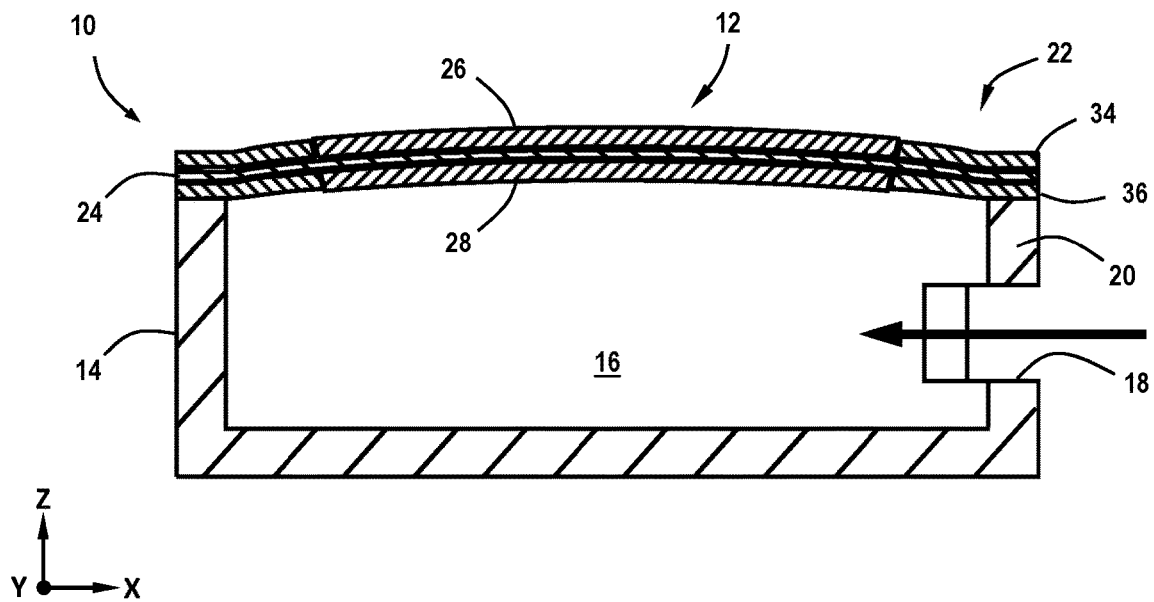
FIG. 5 is the cross-sectional view of the synthetic jet of FIG. 2 with the bimorph disk actuator deflected outwardly and drawing air into a resonant chamber through an orifice of the synthetic jet.
Figure 6:
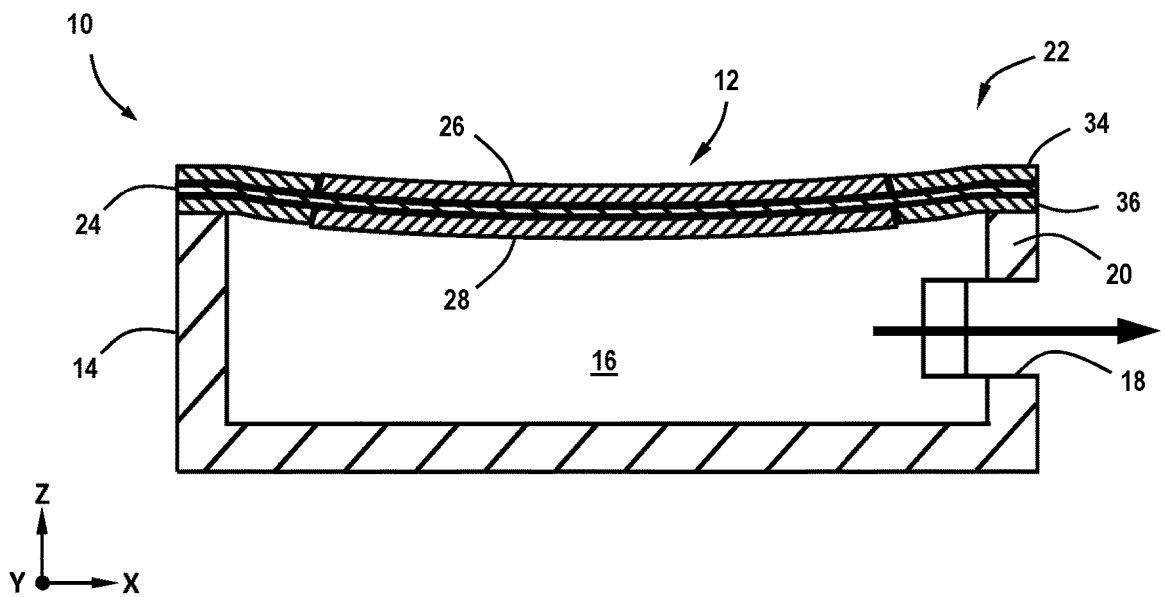
FIG. 6 is the cross-sectional view of the synthetic jet of FIG. 2 with the bimorph disk actuator deflected inwardly and discharging air from the resonant chamber through the orifice of the synthetic jet.

For each piezoceramic disk 26, 28, electrodes are placed on the opposing planar surfaces of the piezoceramic disks 26, 28 for application of voltages across the thicknesses $t_D$ of the piezoceramic disks 26, 28 to create transverse stresses in the piezoceramic disks 26, 28. The transverse stresses cause out-of-plane deformation of the piezoceramic disks 26, 28 in the Z-direction that result in the creation of in-plane stresses and corresponding deformations in the X- and Y-directions according to Poisson's ratio $\gamma_D$ for the piezoceramic material. The piezoceramic material forming the piezoceramic disks 26, 28 has isotropic or quasi-isotropic characteristics so that the piezoceramic disks 26, 28 react consistently in the in-plane directions. The in-plane deformations of the piezoceramic disks 26, 28 create bending moments on the diaphragm 22 due to the rigid connection between the piezoceramic disks 26, 28 and the substrate 24. Resistance to in-plane elongation and compression of the piezoceramic disks 26, 28 at the interface results in deflection of the diaphragm 22 to change the volume in the resonant chamber 16 as shown in FIGS. 5 and 6. In FIG. 5, the voltage applied by the electrodes across the first piezoceramic disk 26 causes the first piezoceramic disk 26 to expand and create a bending moment causing the diaphragm 22 to deflect outwardly. At the same time, the voltage applied by the electrodes across the second piezoceramic disk 28 causes the second piezoceramic disk 28 to contract and create a bending moment also causing the diaphragm 22 to deflect outward, and thereby increase the volume in the resonant chamber 16 and draw air in through the orifice 18. When polarity of the voltages across the piezoceramic disks 26, 28 are reversed, the bending moments on the diaphragm 22 are reversed and the diaphragm 22 deflects inwardly to decrease the volume in the resonant chamber 16 and discharge an air jet through the orifice 18 as shown in FIG. 6.

For piezoceramic actuators, such as the bimorph disk actuator 12 illustrated and described above, there are performance characteristics for the manner in which the bimorph disk actuator 12 will operate that are specified for the synthetic jet 10 to function properly in a given implementation. Key performance indicators include the free or zero load displacement, the blocked force, or maximum force generated by the bimorph disk actuator 12, and the first mode resonant frequency. In the bimorph disk actuator 12, the piezoceramic disks 26, 28 and the portion of the substrate 24 to which they are attached form an active center of the bimorph disk actuator 12. The portion of the substrate 24 and the corresponding portions of the composite rings 34, 36, if any, extending beyond the edges of the piezoceramic disks 26, 28 to the side wall 20 constitute a passive circular ring that responds to the bending moments created by the active center. The key performance indicators are influenced strongly by the stiffness of the passive ring and a ratio of an active diameter of the active center to an outer diameter or passive diameter of the passive circular ring. For example, as the stiffness of the passive circular ring increases and correspondingly increases the overall stiffness of the bimorph disk actuator 12, the displacement caused by a given applied voltage will decrease, but the resonant frequency and blocked force will increase. Conversely, when the stiffness decreases, the displacement will increase for the same applied voltage, but the resonant frequency and the blocked force will decrease.

The particular operating requirements for the synthetic jet 10 in which the bimorph disk actuator 12 is implemented will dictate the values required for the performance indicators. With current piezoelectric actuators, synthetic jet requirement matching is performed by selecting different sizes and thicknesses of piezoceramic disks 26, 28 and adjusting the ratio between the active diameter and the passive diameter. Changing the size and thickness of the piezoceramic disks 26, 28 is limited by the availability of piezoceramic disks of different sizes, and requires changes in the power amplifier voltage delivered to the electrodes. Also, changing the ratio between the active diameter and the passive diameter impacts the first mode resonant frequency and the blocked force. For these reasons, synthetic jet requirement matching is performed for bimorph disk actuators 12 in accordance with the present disclosure by controlling the composite ring stiffnesses $D_{1CR}$, $D_{2CR}$ of the composite rings 34, 36.

By varying the composite ring stiffnesses $D_{1CR}$, $D_{2CR}$ of the composite rings 34, 36 to achieve the overall actuator stiffness that will produce the required performance from the bimorph disk actuator 12, standard piezoceramic disks 26, 28 and a standard substrate 24 can be used across implementations, and without changing the ratio of the active diameter (i.e., the disk outer diameter $OD_D$) to the passive diameter (i.e., the resonant chamber inner diameter $ID_C$) in the bimorph disk actuator 12. The stiffness D of the various components of the bimorph disk actuator 12 may be determined from the thickness t of the components, and the elasticity modulus E and Poisson's ratio $\gamma$ for the material as follows:

$$D = \frac{E * t^3}{12(1 - \gamma)} \quad (1)$$

Those skilled in the art will understand that variations of Eq. (1) will be necessary based on the geometry of a particular component, and the combined stiffness D of various components may be developed using laminate plate theory. Regardless of the form, Eq. (1) illustrates that direct relationships exist between the elasticity modulus E of the material and the thickness t of the component, and the stiffness D of a component.

Using the requirement matching strategy in accordance with the present disclosure, the designer of the synthetic jet 10 and the bimorph disk actuator 12 is presented with at least three options for changing the stiffnesses $D_{1CR}$, $D_{2CR}$ of the composite rings 34, 36 to achieve the operating requirements: 1) changing the infusion material; 2) changing the fill ratio of the infusion material to the epoxy; and 3) changing the thicknesses $t_{1CR}$, $t_{2CR}$ of the composite rings 34, 36. In the first design option, the infusion material may be selected that will achieve the necessary composite ring elasticity moduli $E_{1CR}$, $E_{2CR}$ that will yield the necessary composite ring stiffnesses $D_{1CR}$, $D_{2CR}$ from Eq. (1). Epoxy has an elasticity modulus $E_E$ of approximately 5 GPa that establishes a minimum value for the composite ring elasticity moduli $E_{1CR}$, $E_{2CR}$. Among options for the infusion material are fiberglass with an elasticity modulus $E_{FG}$ in the range of approximately 20-50 GPa, carbon with an elasticity modulus $E_C$ in the range of approximately 30-50 GPa, and glass with an elasticity modulus $E_G$ in the range of approximately 50-90 GPa. Other potential infusion materials having other elasticity moduli E may also be considered. Based on these values, for equal fill ratios of the infusion material, fiberglass would produce the lowest composite ring elasticity moduli $E_{1CR}$, $E_{2CR}$, glass would produce the highest composite ring elasticity moduli $E_{1CR}$, $E_{2CR}$, and carbon would produce composite ring elasticity moduli $E_{1CR}$, $E_{2CR}$, in between. Some implementations may require greater composite ring elasticity moduli $E_{1CR}$, $E_{2CR}$ and corresponding composite ring stiffnesses $D_{1CR}$, $D_{2CR}$, than are achievable with fiberglass, while other implements may require sufficiently low composite ring elasticity moduli $E_{1CR}$, $E_{2CR}$ and composite ring stiffnesses $D_{1CR}$, $D_{2CR}$ that it is impractical to use glass as the infusion material. In other situations, it is contemplated that the use of a blend of two or more infusion materials having different elasticity moduli E may provide an optimal solution for achieving the necessary composite ring elasticity moduli $E_{1CR}$, $E_{2CR}$ and composite ring stiffnesses $D_{1CR}$, $D_{2CR}$ in accordance with the present disclosure.

In the second design option, when a particular infusion material is available or preferred for use in the composite rings 34, 36, or is the only material that can be used to meet the operating requirements, the composite ring elasticity moduli $E_{1CR}$, $E_{2CR}$ and composite ring stiffnesses $D_{1CR}$, $D_{2CR}$ may be tuned to match the requirements by increasing or decreasing the fill ratio of the infused material to the epoxy. As is apparent to those skilled in the art, increasing the amount of the infused material with the higher elasticity modulus E and correspondingly decreasing the epoxy with the lower elasticity modulus $E_E$ will increase the composite ring elasticity moduli $E_{1CR}$, $E_{2CR}$ and composite ring stiffnesses $D_{1CR}$, $D_{2CR}$, and vice versa. Consequently, the same infusion material may be used to produce bimorph disk actuators 12 tuned to a variety of synthetic jet operating requirements.

In the third design option, the infusion material and the fill ratio may be held constant as the composite ring thicknesses $t_{1CR}$, $t_{2CR}$ are increased or decreased as necessary to tune the composite ring elasticity moduli $E_{1CR}$, $E_{2CR}$ and composite ring stiffnesses $D_{1CR}$, $D_{2CR}$. The composite ring thicknesses $t_{1CR}$, $t_{2CR}$ may be reduced down to minimum thicknesses that are required for it to be practical to manufacture the composite rings 34, 36 with the selected infusion material. If the composite ring elasticity moduli $E_{1CR}$, $E_{2CR}$ must be further reduced, the infusion material may be switched to a material with a lower elasticity modulus E, or the fill ratio may be reduced to lower composite ring elasticity moduli $E_{1CR}$, $E_{2CR}$ to the required value when the composite ring thicknesses $t_{1CR}$, $t_{2CR}$ are at or greater than the minimum thicknesses. At the opposite end, the composite ring thicknesses $t_{1CR}$, $t_{2CR}$ will have an upper limit that is equal to the disk thickness $t_D$ so that the composite rings 34, 36 do not extend beyond the outer surfaces of the piezoceramic disks 26, 28. In this case, the composite ring elasticity moduli $E_{1CR}$, $E_{2CR}$ can be increase by changing to an infusion material with a greater elasticity modulus E or increasing the fill ratio of the infusion material if possible.

This example also highlights that the three design options are not mutually exclusive. Any two or all three options may be used in combination and as tradeoffs to achieve the composite ring elasticity moduli $E_{1CR}$, $E_{2CR}$ and composite ring stiffnesses $D_{1CR}$, $D_{2CR}$ that are necessary to match the bimorph disk actuator 12 to the design requirements for a particular implementation. It should further be noted that it is not required that the composite ring thicknesses $t_{1CR}$, $t_{2CR}$ are equal, that the composite ring elasticity moduli $E_{1CR}$, $E_{2CR}$ be equal, or that the composite rings 34, 36 are formed with the same infusion material or with the same fill ratio. The key design requirement is that the completely assembled bimorph disk actuator 12 is matched to the performance requirements for the particular implementation.

The variability of the composite ring thicknesses $t_{1CR}$, $t_{2CR}$ presents unique issues in manufacturing the bimorph disk actuator 12. Previous actuators having the unimorph topology have known differences in thickness between the active area with the piezoceramic disk(s) and the passive area with the diaphragm. Also, the unimorph actuators do not require attachment of rings or other structures on the surfaces in the passive areas of the diaphragm. Only the piezoceramic disk(s) are affixed to the diaphragm. In bimorph topology actuators, the epoxy or other filler material forming the passive area surrounding the piezoceramic disks has a thickness making the passive area flush with the outer surfaces of the piezoceramic disks. Therefore, a press or mold having planar surfaces can be used to shape or form the filler material in the passive area.

Figure 7:
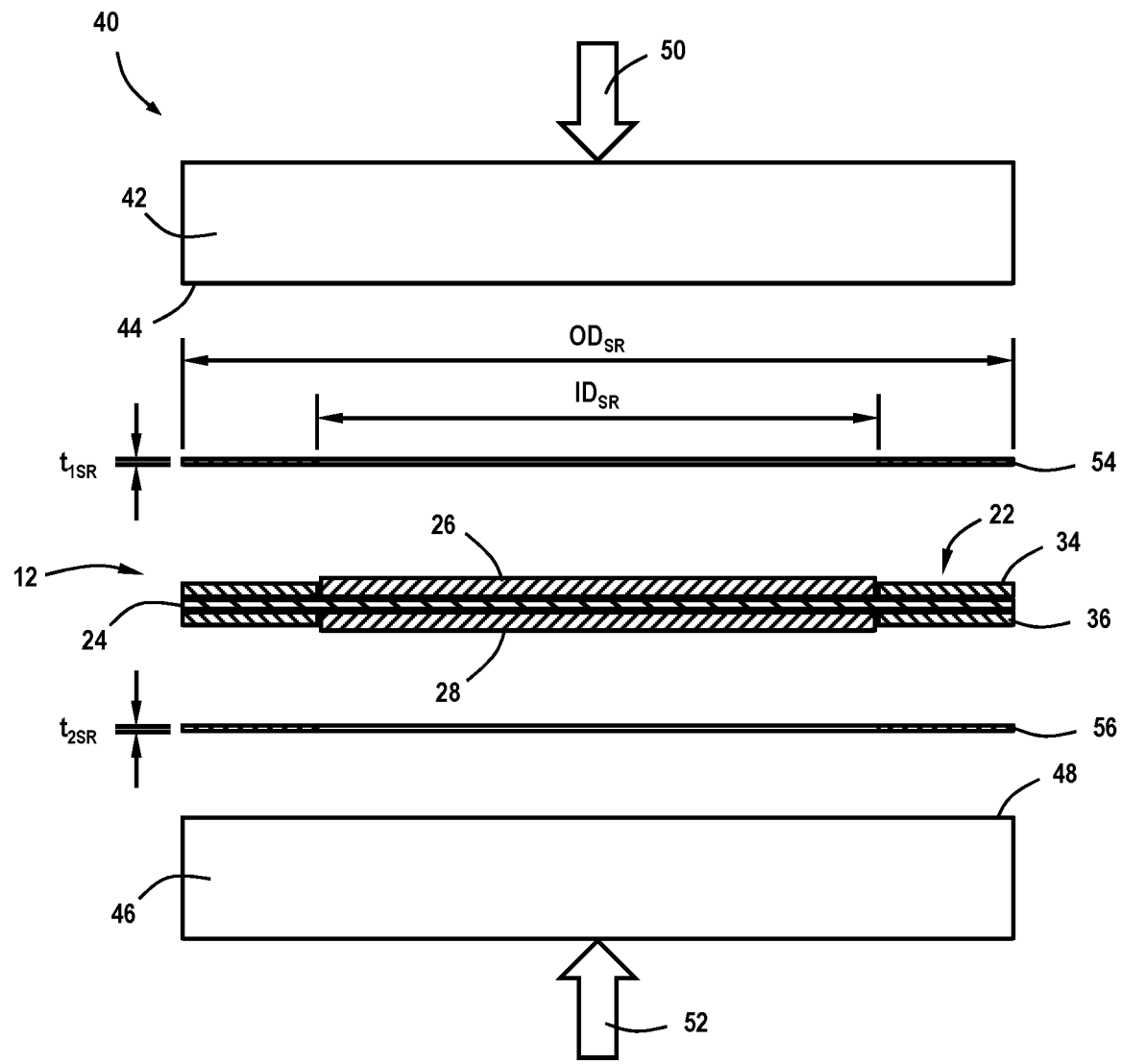
FIG. 7 is a cross-sectional view of the bimorph disk actuator of the synthetic jet of FIG. 1 and an apparatus for fabricating the bimorph disk actuator.

FIG. 7 schematically illustrates an actuator forming apparatus 40 for affixing the composite rings 34, 36 to the substrate 24 in the passive area. The actuator forming apparatus 40 as illustrated includes a first mold body 42 having a first mold planar surface 44, and a second mold body 46 having a second mold planar surface 48. The mold bodies 42, 46 may have mold actuator units (not shown) that move the mold bodies 42, 46 toward each other in the directions of arrows 50, 52. The mold bodies 42, 46 may also generate heat that may be necessary to heat seal the composite rings 34, 36 to the substrate 24.

Because the disk thickness $t_D$ may be greater than one or both of the composite ring thicknesses $t_{1CR}$, $t_{2CR}$, the piezoceramic disks 26, 28 may extend beyond the composite rings 34, 36 in the direction of the mold planar surfaces 44, 48. In such situations, the mold bodies 42, 46 may press down upon the piezoceramic disks 26, 28, but not on the composite rings 34, 36 when the actuator forming apparatus 40 closes, and may not apply pressure and heat. For such configuration of the bimorph disk actuator 12, the actuator forming apparatus 40 may utilize a first spacer ring 54 and/or a second spacer ring 56 to transmit pressure and heat from the mold bodies 42, 46 to the composite rings 34, 36, respectively. The spacer rings 54, 56 may have a spacer ring inner diameter $ID_{SR}$ that is greater than the disk outer diameter $OD_D$, and may be approximately equal to the composite ring inner diameter $ID_{CR}$ so the spacer rings 54, 56 may slide over and around the piezoceramic disks 26, 28 in a similar manner as the composite rings 34, 36. The spacer rings 54, 56 may have a spacer ring outer diameter $OD_{SR}$ that is at least equal to the substrate outer diameter $OD_S$ and the composite ring $OD_{CR}$ so that the spacer rings 54, 56 extend at least to the outer peripheries of the substrate 24 and the composite rings 34, 36 to ensure that pressure and heat are applied across the entire interface between the substrate 24 and the composite rings 34, 36. The spacer rings 54, 56 may be fabricated from a material that is rigid and can withstand pressure exerted by the mold bodies 42, 46, and is thermal conductive to transfer heat from the mold bodies 42, 46 to the composite rings 34, 36 if necessary.

The spacer rings 54, 56 must make up the difference between the disk thickness $t_D$ and composite ring thicknesses $t_{1CR}$, $t_{2CR}$, respectively, to transfer pressure to the composite rings 34, 36, and to present a planar surface of the bimorph disk actuator 12 to the mold planar surfaces 44, 48. That is accomplished by using a first spacer ring 54 having a first spacer ring thickness $t_{1SR}$ that is equal to the difference between the disk thickness $t_D$ and the first composite ring thickness $t_{1CR}$, and a second spacer ring 56 having a second spacer ring thickness $t_{1SR}$ that is equal to the difference between the disk thickness $t_D$ and the second composite ring thickness $t_{2CR}$. Once the spacer rings 54, 56 are in place, the mold actuator units may force the mold bodies 42, 46 in the directions of the arrows 50, 52 and press the substrate 24, the piezoceramic disks 26, 28 and the composite rings 34, 36 together and apply heat. While the apparatus 40 is closed, a pressure sensitive adhesive and/or heat sensitive adhesive may adhere the composite rings 34, 36 the corresponding substrate surfaces 30, 32, respectively. Alternatively, the pressure and heat may cause the epoxy in the substrate 24 and the composite rings 34, 36 to fuse or weld together to fixedly attach the composite rings 34, 36 to the substrate 24. After sufficient time elapses, the mold bodies 42, 46 may be opened and the spacer rings 54, 56 removed from around the piezoceramic disks 26, 28, leaving the completed bimorph disk actuator 12.

INDUSTRIAL APPLICABILITY

Figure 8:
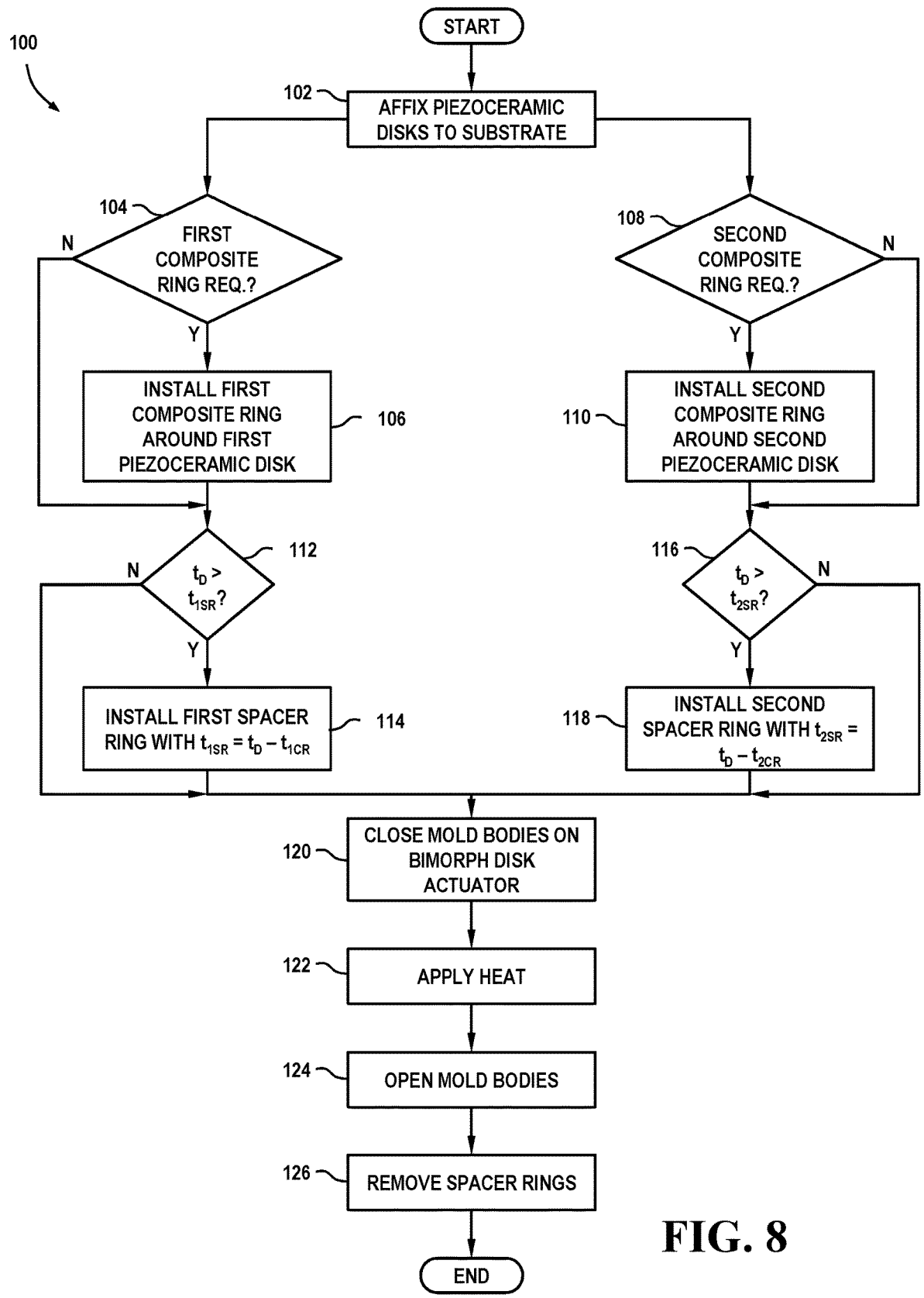
FIG. 8 is a flow diagram of an actuator fabrication routine in accordance with the present disclosure for the bimorph disk actuator of FIG. 3.

Once the bimorph disk actuator 12 is designed with or without the composite rings 34, 36 to match the performance requirements for a particular synthetic jet 10, the bimorph disk actuators 12 can be fabricated in preparation for installation on the synthetic jets 10. FIG. 8 illustrates an exemplary actuator fabrication routine 100 that may be implemented using the actuator forming apparatus 40. The routine may begin at a block 102 where the piezoceramic disks 26, 28 may be affixed onto the substrate surfaces 30, 32 of the substrate 24. As discussed, the piezoceramic disks 26, 28 may be standard disks that are prefabricated and available without the necessity of custom fabrication to meet the requirements for the synthetic jet 10. The piezoceramic disks 26, 28 may be adhered to the corresponding substrate surfaces 30, 32 of the substrate 24 with an appropriate adhesive that will withstand the stresses and bending moments generated when voltages are applied to the piezoceramic disks 26, 28.

After the piezoceramic disks 26, 28 are affixed to the substrate 24 are the block 102, control may pass to block 104 to determine whether the design of the bimorph disk actuator 12 requires the first composite ring 34 in the passive area of the bimorph disk actuator 12. If the design includes the first composite ring 34 to provide the necessary stiffness D in the passive area, control may pass to a block 106 where the first composite ring 34 with the designed first composite ring thickness $t_{1CR}$ and the first composite ring elasticity modulus $E_{1CR}$ is installed around the first piezoceramic disk 26. The first composite ring 34 may be placed on the first substrate surface 30 of the substrate 24 with the first piezoceramic disk 26 inserted through the opening in the first composite ring 34 so the first composite ring 34 faces and engages the first substrate surface 30. If the design does not include the first composite ring 34 at the block 104, the block 106 may be bypassed and a first composite ring 34 is not installed in the bimorph ring actuator 12.

In parallel to installing the first composite ring 34 if necessary at the blocks 104, 106, control may pass to a block 108 to determine whether the design of the bimorph disk actuator 12 requires the second composite ring 36 in the passive area of the bimorph disk actuator 12. If the design includes the second composite ring 36 to provide the necessary stiffness D in the passive area, control may pass to a block 110 where the second composite ring 36 is installed around the second piezoceramic disk 28. The second composite ring 36 may be placed on the second substrate surface 32 of the substrate 24 with the second piezoceramic disk 28 inserted through the opening in the second composite ring 36 so the second composite ring 36 faces and engages the second substrate surface 32. If the design does not include the second composite ring 36 at the block 108, the block 110 may be bypassed and a second composite ring 36 is not installed in the bimorph ring actuator 12.

After installing the first composite ring 34 if necessary at the blocks 104, 106, control may pass to a block 112 to determine whether the first spacer ring 54 is required by comparing the first composite ring thickness $t_{1CR}$ to the disk thickness $t_D$. If the disk thickness $t_D$ is greater than the first spacer ring thickness $t_{1CR}$, the first composite ring 34 is thinner than the first piezoceramic disk 26 and the first side of the bimorph disk actuator 12 will not present a planar surface to the first mold planar surface 44. In this situation, the first spacer ring 54 is required to present a planar surface with the first piezoceramic disk 26. Control passes to a block 114 where the first spacer ring 54 is installed over the first composite ring 34. The first spacer ring 54 will have a first spacer ring thickness $t_{1SR}$ that is equal to the difference between the disk thickness $t_D$ and the first composite ring thickness $t_{1CR}$ so that the combined thicknesses $t_{1CR}$, $t_{1SR}$ will equal the disk thickness $t_D$. If the disk thickness $t_D$ is not greater than the first spacer ring thickness $t_{1CR}$ at the block 112, the first composite ring thickness $t_{1CR}$ is equal to the disk thickness $t_D$, and the first piezoceramic disk 26 and the first composite ring 34 will present a planar surface to the first mold planar surface 44. With this actuator design, the first spacer ring 54 is not required and the installation step at the block 114 can be bypassed.

As the first spacer ring 54 is being installed if necessary at the blocks 112, 114, control may pass to a block 116 to determine whether the second spacer ring 56 is required by comparing the second composite ring thickness $t_{2CR}$ to the disk thickness $t_D$. As with the first spacer ring 54, if the disk thickness $t_D$ is greater than the second spacer ring thickness $t_{2CR}$, the second composite ring 36 is thinner than the first piezoceramic disk 28 and the second side of the bimorph disk actuator 12 will not present a planar surface to the second mold planar surface 48. The second spacer ring 56 is required to present a planar surface with the second piezoceramic disk 28. Control passes to a block 118 where the second spacer ring 56 is installed over the second composite ring 36. The second spacer ring 56 will have a second spacer ring thickness $t_{2SR}$ that is equal to the difference between the disk thickness $t_D$ and the second composite ring thickness $t_{2CR}$ so that the combined thicknesses $t_{2CR}$, $t_{2SR}$ will equal the disk thickness $t_D$. If the disk thickness $t_D$ is not greater than the second spacer ring thickness $t_{2CR}$ at the block 116, the second composite ring thickness $t_{2CR}$ is equal to the disk thickness $t_D$, and the second piezoceramic disk 28 and the second composite ring 36 will present a planar surface to the second mold planar surface 48. With this actuator design, the second spacer ring 56 is not required and the installation step at the block 118 can be bypassed.

After the composite rings 34, 36 and the spacer rings 54, 56 are installed as necessary based on the actuator design, control may pass to a block 120 to begin the process of securing the composite rings 34, 36 to the substrate 24 and thereby forming the diaphragm 22. At the block 120, the mold actuator units close the mold bodies 42, 46 down onto the bimorph disk actuator 12 with the mold planar surfaces 44, 48 engaging the corresponding sides of the bimorph disk actuator 12. The mold bodies 42, 46 will apply sufficient pressure to force the substrate 24, the composite rings 34, 36 and the spacer rings 54, 56 together without crushing the piezoceramic disks 26, 28. The mold planar surfaces 44, 48 and/or the spacer rings 54, 56 will ensure that the substrate 24 and the composite rings 34, 36 are pressed flat by the pressure applied by the mold bodies 42, 46 and the passive area will be planar and perform according to the actuator design when the bimorph disk actuator 12 is installed on the synthetic jet 10. Where a pressure sensitive adhesive is used to secure the composite rings 34, 36 to the substrate 24, the pressure exerted by the mold bodies 42, 46 may be sufficient to activate the pressure sensitive adhesive and bond the composite rings 34, 36 to the substrate 24.

In the illustrated embodiment, control passes to a block 122 where heat is applied to the bimorph disk actuator 12 by the mold bodies 42, 46. Heat may be required where a heat sensitive adhesive is used to secure the composite rings 34, 36 to the substrate 24, or where the epoxy in the composite rings 34, 36 will be fused or welded with the epoxy in the substrate 24 to bind the components together. Consequently, the applied heat will be sufficient to activate the heat sensitive adhesive or to melt the epoxy at the interfaces between the composite rings 34, 36 and the substrate 24. Of course, the heat application step of the block 122 may be omitted where heat is not required to bond the composite rings 34, 36 to the substrate 24.

After the composite rings 34, 36 are bonded to the substrate 24, control may pass to a block 124 where the mold actuator units separate the mold bodies 42, 46 to open the actuator forming apparatus 40. With the mold bodies 42, 46 separated, the bimorph disk actuator 12 may be removed from the apparatus 40. After removal, control may pass to a block 126 where the spacer rings 54, 56, if any, are removed from the bimorph disk actuator 12 so that the bimorph disk actuator 12 is ready for installation in the synthetic jet 10 with the outer portions of the second composite ring 36, or the outer portions of the substrate 24 where the actuator design does not require the second composite ring 36, secured to the side wall 20 to seal the resonant chamber 16 with the exception of the orifice 18.

The bimorph disk actuator 12 in accordance with the present disclosure allows for the use of standard piezoceramic disks 26, 28 in forming actuators 12 for a variety of different synthetic jets 10 instead of needing to fabricate custom piezoceramic disks to meet the operating requirements of the synthetic jets 10. Such custom fabrication can increase the costs of the bimorph disk actuator 12. In contrast, the composite rings 34, 36 fabricated from epoxy infused with various materials are relatively inexpensive to design and manufacture. The design of the bimorph disk actuator 12 for a particular implementation may be simplified by eliminating custom design of piezoceramic disks, adjusting the power amplifier voltage for each set of design requirements resulting in changes to the disk design, and changing the ratio of the active diameter of the active center to the passive diameter of the passive area. The design may also reduce the number of variables that are controlled to match the bimorph disk actuator 12 to the operating requirements, such as the composite ring thicknesses $t1CR$, $t2CR$, the composite ring elasticity moduli $E1CR$, $E2CR$, and the infusion material and fill ratio used in the composite material from which the composite rings 34, 36 are fabricated. In the present design, control of the stiffness $D$ and the thickness $t$ of the passive area of the bimorph disk actuator 12 is used to tune the bimorph disk actuator 12 to the unique requirements of the specific applications in which the bimorph disk actuator 12 is implemented.

Use of the thin composite substrate 24 versus the previous metallic substrates discussed above in relation to the unimorph topology may improve the efficiency of the bimorph disk actuator 12 in accordance with the present disclosure. With the composite substrate 24, less strain energy created when voltage is applied across the piezoceramic disks 26, 28 will be used up in bending the substrate 24. Instead the strain energy will be available for work in puffing air. Increased air flow at the same voltage results in greater efficiency in the synthetic jets 10.

While the preceding text sets forth a detailed description of numerous different embodiments, it should be understood that the legal scope of protection is defined by the words of the claims set forth at the end of this patent. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims defining the scope of protection.

It should also be understood that, unless a term was expressly defined herein, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to herein in a manner consistent with a single meaning, that is done for sake of clarity only so as to not confuse the reader, and it is not intended that such claim term be limited, by implication or otherwise, to that single meaning.

What is claimed is:

1. A bimorph disk actuator for a synthetic jet having an outer housing having a cylindrical side wall defining a resonant chamber and having a resonant chamber inner diameter, the bimorph disk actuator comprising:
    a substrate formed from a substrate composite material and having a first substrate surface, a second substrate surface opposite the first substrate, and a substrate outer diameter that is greater than the resonant chamber inner diameter;
    a first piezoceramic disk rigidly connected to the first substrate surface of the substrate;
    a second piezoceramic disk rigidly connected to the second substrate surface of the substrate; and
    a first composite ring having a composite ring outer diameter that is greater than the resonant chamber inner diameter, and being formed from a first ring composite material, rigidly connected to the first substrate surface and surrounding the first piezoceramic disk.

2. The bimorph disk actuator of claim 1, comprising a second composite ring having the composite ring outer diameter that is greater than the resonant chamber inner diameter, and being formed from a second ring composite material, rigidly connected to the second substrate surface and surrounding the second piezoceramic disk.

3. The bimorph disk actuator of claim 1, wherein a first composite ring thickness is less than a piezoceramic disk thickness.

4. The bimorph disk actuator of claim 1, where the first composite ring has a first composite ring thickness that is dimensioned so that the bimorph disk actuator has an actuator stiffness that is equal to a predetermined actuator stiffness for an implementation of the bimorph disk actuator in the synthetic jet.

5. The bimorph disk actuator of claim 1, where the first ring composite material of the first composite ring has a first composite ring fill ratio of an infused material to an epoxy surrounding the infused material that causes the bimorph disk actuator to have an actuator stiffness that is equal to a predetermined actuator stiffness for an implementation of the bimorph disk actuator in the synthetic jet.

6. The bimorph disk actuator of claim 1, wherein the first composite ring extends from a first disk outer edge of the first piezoceramic disk to a substrate outer edge of the substrate so that the composite ring outer diameter is approximately equal to the substrate outer diameter.

7. The bimorph disk actuator of claim 1, wherein the substrate, the first piezoceramic disk and the second piezoceramic disk are circular, and the first piezoceramic disk and the second piezoceramic disk are concentrically aligned with the substrate.

8. The bimorph disk actuator of claim 1, wherein the first piezoceramic disk and the second piezoceramic disk have a disk outer diameter, and wherein the first composite ring has a composite ring inner diameter that is greater than the disk outer diameter.

9. The bimorph disk actuator of claim 1, wherein a radially outward portion of the first composite ring overhangs and is attached to an upper edge of the cylindrical side wall.

10. The bimorph disk actuator of claim 2, wherein the first composite ring has a first composite ring thickness, and the second composite ring has a second composite ring thickness that is equal to the first composite ring thickness.

11. The bimorph disk actuator of claim 2, wherein the first composite ring has a first composite ring thickness, and the second composite ring has a second composite ring thickness that is not equal to the first composite ring thickness.

12. A bimorph disk actuator comprising:
a substrate formed from a substrate composite material and having a first substrate surface, a second substrate surface opposite the first substrate, and a substrate outer diameter;
a first piezoceramic disk rigidly connected to the first substrate surface of the substrate;
a second piezoceramic disk rigidly connected to the second substrate surface of the substrate;
a first composite ring having a composite ring outer diameter that is approximately equal to the substrate outer diameter, and being formed from a first ring composite material, rigidly connected to the first substrate surface and surrounding the first piezoceramic disk, wherein the first composite ring deflects with the substrate when voltage applied to the first piezoceramic disk and the second piezoceramic disk causes the first piezoceramic disk and the second piezoceramic disk to deflect.

13. The bimorph disk actuator of claim 12, comprising a second composite ring having the composite ring outer diameter that is approximately equal to the substrate outer diameter, and being formed from a second ring composite material, rigidly connected to the second substrate surface and surrounding the second piezoceramic disk, wherein the second composite ring deflects with the substrate when voltage applied to the first piezoceramic disk and the second piezoceramic disk causes the first piezoceramic disk and the second piezoceramic disk to deflect.

14. The bimorph disk actuator of claim 13, wherein the first composite ring has a first composite ring thickness, and the second composite ring has a second composite ring thickness that is equal to the first composite ring thickness.

15. The bimorph disk actuator of claim 13, wherein the first composite ring has a first composite ring thickness, and the second composite ring has a second composite ring thickness that is not equal to the first composite ring thickness.

16. The bimorph disk actuator of claim 12, wherein a first composite ring thickness is less than a piezoceramic disk thickness.

17. The bimorph disk actuator of claim 12, wherein the first piezoceramic disk and the second piezoceramic disk have a disk outer diameter, and wherein the first composite ring has a composite ring inner diameter that is greater than the disk outer diameter.

18. A bimorph disk actuator for a synthetic jet having an outer housing having a cylindrical side wall defining a resonant chamber and having a resonant chamber inner diameter, the bimorph disk actuator comprising:
a substrate formed from a substrate composite material and having a first substrate surface, a second substrate surface opposite the first substrate, and a substrate outer diameter that is greater than the resonant chamber inner diameter;
a first piezoceramic disk rigidly connected to the first substrate surface of the substrate and having a disk thickness and a disk outer diameter;
a second piezoceramic disk rigidly connected to the second substrate surface of the substrate and having the disk thickness and the disk outer diameter;
a first composite ring having a first composite ring thickness is less than or equal to the disk thickness, having a composite ring inner diameter that is greater than the disk outer diameter, having a composite ring outer diameter that is greater than the resonant chamber inner diameter, and being formed from a first ring composite material, rigidly connected to the first substrate surface and surrounding the first piezoceramic disk; and
a second composite ring having a second composite ring thickness is less than or equal to the disk thickness, having the composite ring inner diameter that is greater than the disk outer diameter, having the composite ring outer diameter that is greater than the resonant chamber inner diameter, and being formed from a second ring composite material, rigidly connected to the second substrate surface and surrounding the second piezoceramic disk.

19. The bimorph disk actuator of claim 18, wherein the first composite ring outer diameter is approximately equal to the substrate outer diameter.

20. The bimorph disk actuator of claim 18, wherein the second composite ring thickness is not equal to the first composite ring thickness.

* * * * *